(12) United States Patent
Abdalla et al.

(10) Patent No.: US 10,720,851 B2
(45) Date of Patent: Jul. 21, 2020

(54) PRINTED CIRCUIT BOARD POWER CELL WITH ISOLATION AND MEDIUM VOLTAGE MULTI-CELL POWER SUPPLY

(71) Applicant: Siemens Aktiengesellschaft, München (DE)

(72) Inventors: Abdelnassir Abdalla, Monroeville, PA (US); John B. Balicki, Jr., Pittsburgh, PA (US); Edward Alan Cheesman, Chicora, PA (US); Liviu Mihalache, Valencia, PA (US); Edward A. Novack, New Kensington, PA (US); Mukul Rastogi, Murrysville, PA (US)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 15/751,399

(22) PCT Filed: Sep. 9, 2016

(86) PCT No.: PCT/US2016/050862
§ 371 (c)(1),
(2) Date: Feb. 8, 2018

(87) PCT Pub. No.: WO2017/044681
PCT Pub. Date: Mar. 16, 2017

(65) Prior Publication Data
US 2018/0241317 A1 Aug. 23, 2018

Related U.S. Application Data

(60) Provisional application No. 62/217,248, filed on Sep. 11, 2015.

(51) Int. Cl.
*H02M 7/483* (2007.01)
*H02M 7/00* (2006.01)
(Continued)

(52) U.S. Cl.
CPC .......... *H02M 7/003* (2013.01); *H02M 7/483* (2013.01); *H02M 7/49* (2013.01); *H05K 1/0262* (2013.01)

(58) Field of Classification Search
CPC ..................................................... H02M 7/483
(Continued)

(56) References Cited

U.S. PATENT DOCUMENTS

| 5,625,545 A | 4/1997 | Hammond | |
|---|---|---|---|
| 2003/0043611 A1* | 3/2003 | Bockle | H05B 33/0815 363/131 |

(Continued)

FOREIGN PATENT DOCUMENTS

| CN | 102484154 A | 5/2012 |
|---|---|---|
| CN | 103738410 A | 4/2014 |

(Continued)

OTHER PUBLICATIONS

PCT International Search Report and Written Opinion of International Searching Authority dated Jan. 30, 2017 corresponding to PCT International Application No. PCT/US2016/050862 filed Sep. 9, 2016.

*Primary Examiner* — Thienvu V Tran
*Assistant Examiner* — Nusrat Quddus

(57) ABSTRACT

A printed circuit board (PCB) power cell (100) for arranging in a multi-cell power supply (500) includes a housing assembly (102) with a multiple section housing (104, 106), and a PCB assembly (120) positioned within the housing assembly (102), wherein the housing assembly (102) and the PCB assembly (120) are configured to provide an integrated voltage isolation of the power cell (100) which supports an output voltage of the multi-cell power supply (500). Furthermore, a multi-cell power supply (500) including a PCB power cell (100) with isolation is described.

15 Claims, 7 Drawing Sheets

(51) Int. Cl.
*H02M 7/49* (2007.01)
*H05K 1/02* (2006.01)

(58) Field of Classification Search
USPC .......................................... 363/71, 131–134
See application file for complete search history.

(56) References Cited

U.S. PATENT DOCUMENTS

| | | | |
|---|---|---|---|
| 2003/0133318 A1* | 7/2003 | Radosevich | H02M 1/44 363/131 |
| 2007/0081372 A1* | 4/2007 | Xiong Zeng | H02M 7/5387 363/132 |
| 2009/0316457 A1* | 12/2009 | Friebe | H02J 3/38 363/131 |
| 2010/0282293 A1 | 11/2010 | Meyer et al. | |
| 2010/0328848 A1* | 12/2010 | Ledezma | H02M 7/49 361/603 |
| 2012/0156543 A1 | 6/2012 | Cicero et al. | |
| 2015/0340964 A1* | 11/2015 | Modeer | H02J 3/383 307/82 |
| 2016/0141973 A1* | 5/2016 | Abdalla | H02M 5/458 363/36 |
| 2016/0181939 A1* | 6/2016 | dos Santos | H02M 7/483 136/251 |

FOREIGN PATENT DOCUMENTS

| | | |
|---|---|---|
| CN | 203733874 U | 7/2014 |
| DE | 102012208745 A1 | 11/2012 |
| DE | 102012214761 A1 | 2/2014 |
| DE | 102012216123 A1 | 3/2014 |
| KR | 19990064164 A | 7/1999 |
| RU | 2404482 C2 | 11/2010 |
| WO | 1997014206 A1 | 4/1997 |
| WO | 2010019754 A2 | 2/2010 |
| WO | 2010093702 A2 | 8/2010 |
| WO | 2010148009 A2 | 12/2010 |
| WO | 2013000512 A1 | 1/2013 |
| WO | 2014210125 A1 | 12/2014 |

* cited by examiner

PRINTED CIRCUIT BOARD POWER CELL WITH ISOLATION AND MEDIUM VOLTAGE MULTI-CELL POWER SUPPLY

CROSS REFERENCE TO RELATED APPLICATIONS

This application is the U.S. National Stage of International Application No. PCT/US2016/050862 filed 9 Sep. 2016 and claims benefit thereof, the entire content of which is hereby incorporated herein by reference. The International Application No. PCT/US2016/050862 claims priority to U.S. Provisional Application No. 62/217,248 filed 11 Sep. 2015, the entire content of which is hereby incorporated herein by reference.

BACKGROUND

1. Field

Aspects of the present invention generally relate to printed circuit board (PCB) power cells with isolation and medium voltage multi-cell power supplies. Throughout the specification, the terms "drive", "drive system" and "power supply" can be used interchangeably.

2. Description of the Related Art

Power supplies configured to control a flow of energy between a first alternating current (AC) system and a second AC system are used in a variety of commercial and industrial applications. Various power supplies convert energy from a first frequency and voltage to a second frequency and voltage. For example, a power supply is typically used in AC motor control and operation systems. One way to implement such a power supply is a drive, herein also referred to as a drive system, such as for example a modular medium voltage drive, including one or more power cells, each power cell including multiple solid state converters with an intermediate direct current (DC) link. One exemplary system incorporating such power cells is discussed in U.S. Pat. No. 5,625,545 to Hammond, the disclosure of which is hereby incorporated by reference in its entirety.

A modular medium voltage drive is typically built by adding several low voltage power cells connected in series, on each phase, in order to achieve a desired output medium voltage required to drive an electric motor coupled to the modular medium voltage drive. Depending for example on the type of electric motor, a drive output voltage may range from anywhere between 1 kV to 11 kV. Even though the individual power cells can comprise a lower voltage, the output medium voltage of the drive can be significantly higher. The circumstance of the output voltage being significantly higher than voltages of the individual power cells adds significant challenges to construction of the medium voltage drive due to minimum spacing required between various conductive parts and components of the power cells and the drive system. Typically, a drive system enclosure is metallic and at least parts of each power cell enclosure are also metallic. Therefore, when the power cells are mounted in a drive system cabinet, additional work is required to maintain proper isolation between the various power cells and between the power cells and the system cabinet. Such proper isolation typically requires insulating non-conductive material which needs to be added to the drive system which is expensive and further increases labour costs of the drive.

Thus, a need exists in the art for an improved power cell and an improved drive system comprising power cells.

SUMMARY

Briefly described, aspects of the present invention relate to a printed circuit board (PCB) power cell with isolation and a modular medium voltage multi-cell power supply.

A first aspect of the present invention provides a PCB power cell for arranging in a multi-cell power supply comprising a housing assembly comprising a multiple section housing; and a PCB assembly positioned within the housing assembly; wherein the housing assembly and the PCB assembly are configured to provide an integrated voltage isolation of the power cell which supports an output voltage of the multi-cell power supply.

A second aspect of the present invention provides a multi-cell power supply for receiving power from a source and delivering power at an output to a load, the power supply comprising a plurality of PCB power cells, each power cell comprising a housing assembly comprising a multiple section housing; and a PCB assembly positioned within the housing assembly; wherein the housing assembly and the PCB assembly are configured to provide an integrated voltage isolation of the power cell which supports an output voltage of the multi-cell power supply.

DETAILED DESCRIPTION

To facilitate an understanding of embodiments, principles, and features of the present invention, they are explained hereinafter with reference to implementation in illustrative embodiments. In particular, they are described in the context of printed circuit board (PCB) power cells and medium voltage multi-cell power supplies suitable for electrodynamic machines, in particular for alternating current (AC) electric motors. Embodiments of the present invention, however, are not limited to use in the described devices or methods.

As used herein, a "medium voltage" is a voltage of greater than about 690V and less than about 69 KV, and a "low voltage" is a voltage less than about 690V. Persons of ordinary skill in the art will understand that other voltage levels may be specified as "medium voltage" and "low voltage". For example, in some embodiments, a "medium voltage" may be a voltage between about 3 kV and about 69 kV, and a "low voltage" may be a voltage less than about 3 kV.

The components and materials described hereinafter as making up the various embodiments are intended to be illustrative and not restrictive. Many suitable components and materials that would perform the same or a similar function as the materials described herein are intended to be embraced within the scope of embodiments of the present invention.

Figure 1:
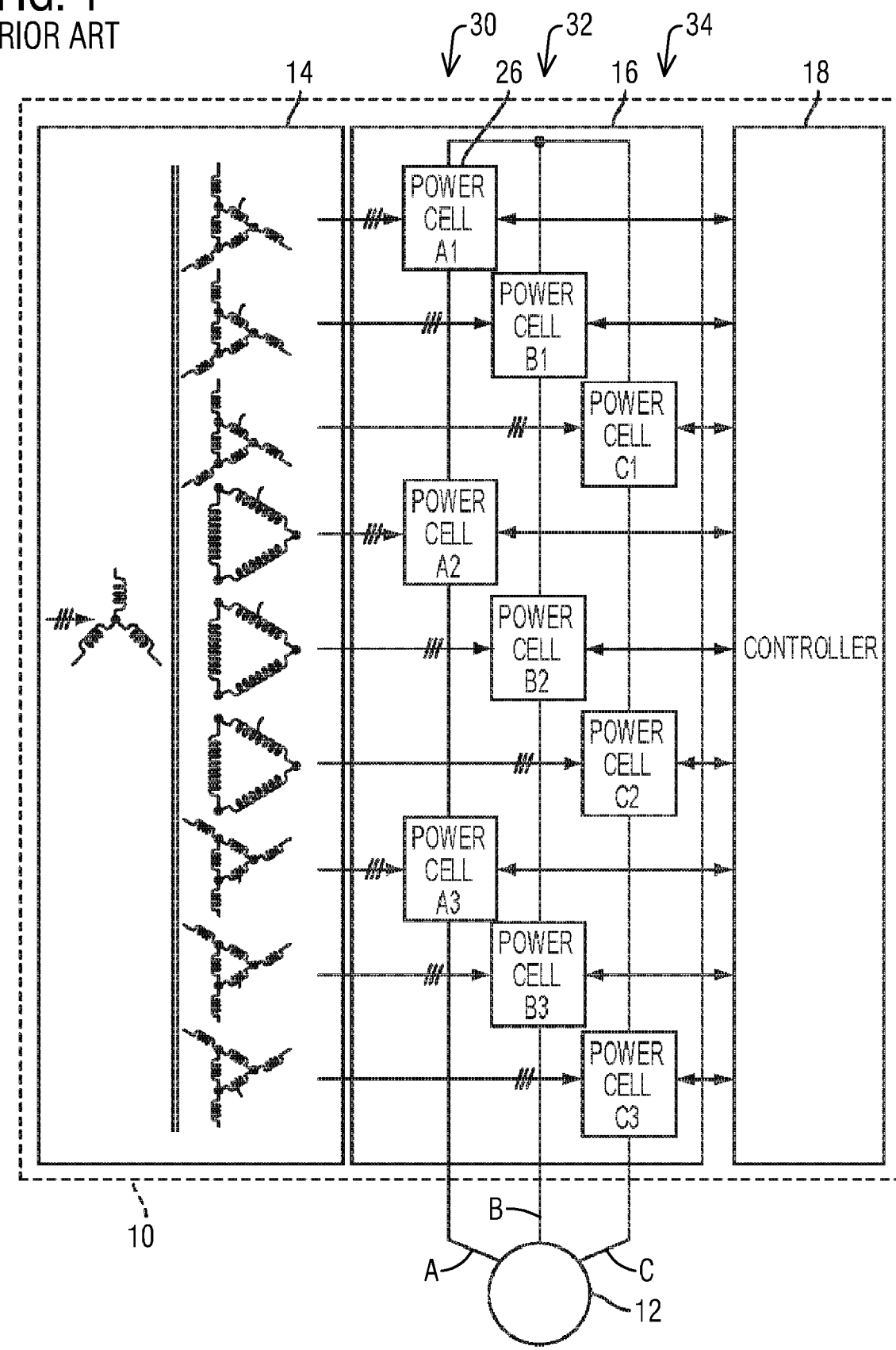
FIG. 1 illustrates a block diagram of a known modular multi-cell power supply.
Figure 2:
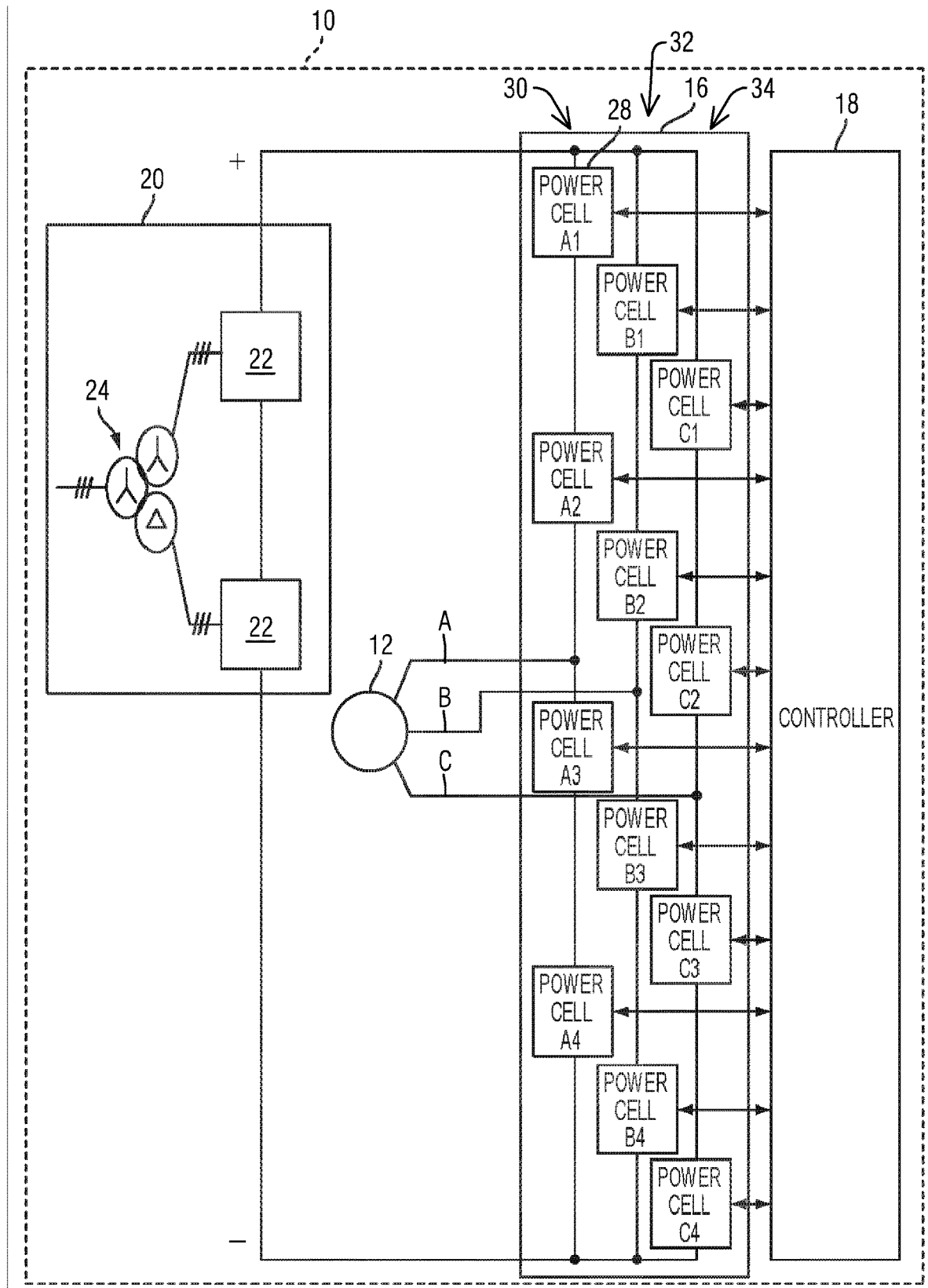
FIG. 2 illustrates a block diagram of another known modular multi-cell power supply.

FIG. 1 and FIG. 2 each illustrate a block diagram of a known modular multi-cell power supply 10 that receives three-phase power from an AC source, and delivers power to a load 12, e.g., a three-phase AC motor.

As shown in FIG. 1, a multi-cell power supply 10 includes a transformer 14, a power circuit 16, and a controller 18. The transformer 14 includes a primary winding that excites nine secondary windings, and power circuit 16 includes multiple PCB power cells 26, herein simply referred to as power cells 26, that are operably coupled to the secondary windings, respectively, of the transformer 14. As the power supply 10 comprises nine secondary windings, and a power cell 26 is operably coupled to each secondary winding, the power supply 10 comprises nine power cells 26. Of course, the power supply 10 can comprise more or less than nine power cells 26 and/or more or less than nine secondary windings depending on a type of the power supply 10 and/or a type of the load 12 coupled to the power supply 10.

The power cells 26 can be rated for lower voltages and are configured to provide a medium voltage output to the load 12. In particular, each output phase A, B, C of the power circuit 16 is fed by a group of series-connected power cells 26. Outputs of the power cells 26 are coupled in series in a first phase group 30, at second phase group 32, and a third phase group 34. Each phase output voltage is a sum of the output voltages of the power cells 26 in the respective phase group 30, 32 and 34. For example, the first phase group 30 comprises power cells 26 labelled A1, A2 and A3, wherein the phase output voltage of the output phase A is the sum of the output voltages of the power cells A1, A2 and A3. The same applies to output phase B and power cells B1, B2, B3, and output phase C and power cells C1, C2, C3. In this regard, the power circuit 16 delivers a medium voltage output to load 12 using lower voltage rated power cells 26 that include components rated to lower voltage standards. Each power cell 26 is coupled, e.g., for example via an optical fiber communication link, to controller 18, which may use current feedback and voltage feedback to control operation of the power cells 26.

As illustrated in FIG. 2, a multi-cell power supply 10 includes three-phase AC power supply 20, a power circuit 16, and a controller 18. The three-phase AC power supply 20 includes two diode bridges which are each connected on the AC voltage side to secondary windings of a power converter transformer 24, and are electrically connected in series on the DC voltage side. A positive and a negative DC voltage bus are provided for the parallel connection of these phase groups. The power circuit 16 includes power cells 28 that are coupled to the DC voltage bus created by the power supply 20. The power cells 28 are for example lower voltage rated and are configured to provide medium voltage output to load 12. Although the load 12 may be illustrated as being within the multi-cell power supply 10, the load 12 is not part of the multi-cell power supply 10. Rather, the load 12 is separate from, and connected to, the multi-cell power supply 10, as more clearly shown in FIG. 1.

Each output phase A, B, C of the power circuit 16 is fed by a group of series-connected power cells 28, also labelled A1-A4, B1-B4 and C1-C4 with reference to the output phases A, B, C. The power cells 28 are coupled in series in a first phase group 30, a second phase group 32, and a third phase group 34. Each phase output voltage is a sum of the output voltages of the power cells 28 in the phase group 30, 32 and 34 as described before with reference to FIG. 1. The power circuit 16 delivers a medium voltage output to the load 12 using lower voltage rated power cells 28 that include components rated to lower voltage standards. Each power cell 28 is coupled, e.g., for example via optical fiber communication link(s), to the controller 18, which can use current feedback and voltage feedback to control operation of the power cells 28.

It should be noted that in FIG. 1 and FIG. 2 the number of power cells 26, 28 in each phase group 30, 32, 34 can be between 2 and 12 to provide different medium voltage outputs as required by the load 12. As noted before, in the embodiment of FIG. 1, the number of secondary windings of transformer 14 matches the number of power cells 26. In the embodiment of FIG. 2, a number of diode bridges and transformer secondary windings can vary from 1 to 6 to allow for harmonic cancellation on the primary side of the transformer 24. It will be appreciated by those of ordinary skill in the art that other cell counts and diode bridge counts may be used depending upon the application and that the configurations shown and described herein are intended to be exemplary in natures.

Figure 3:
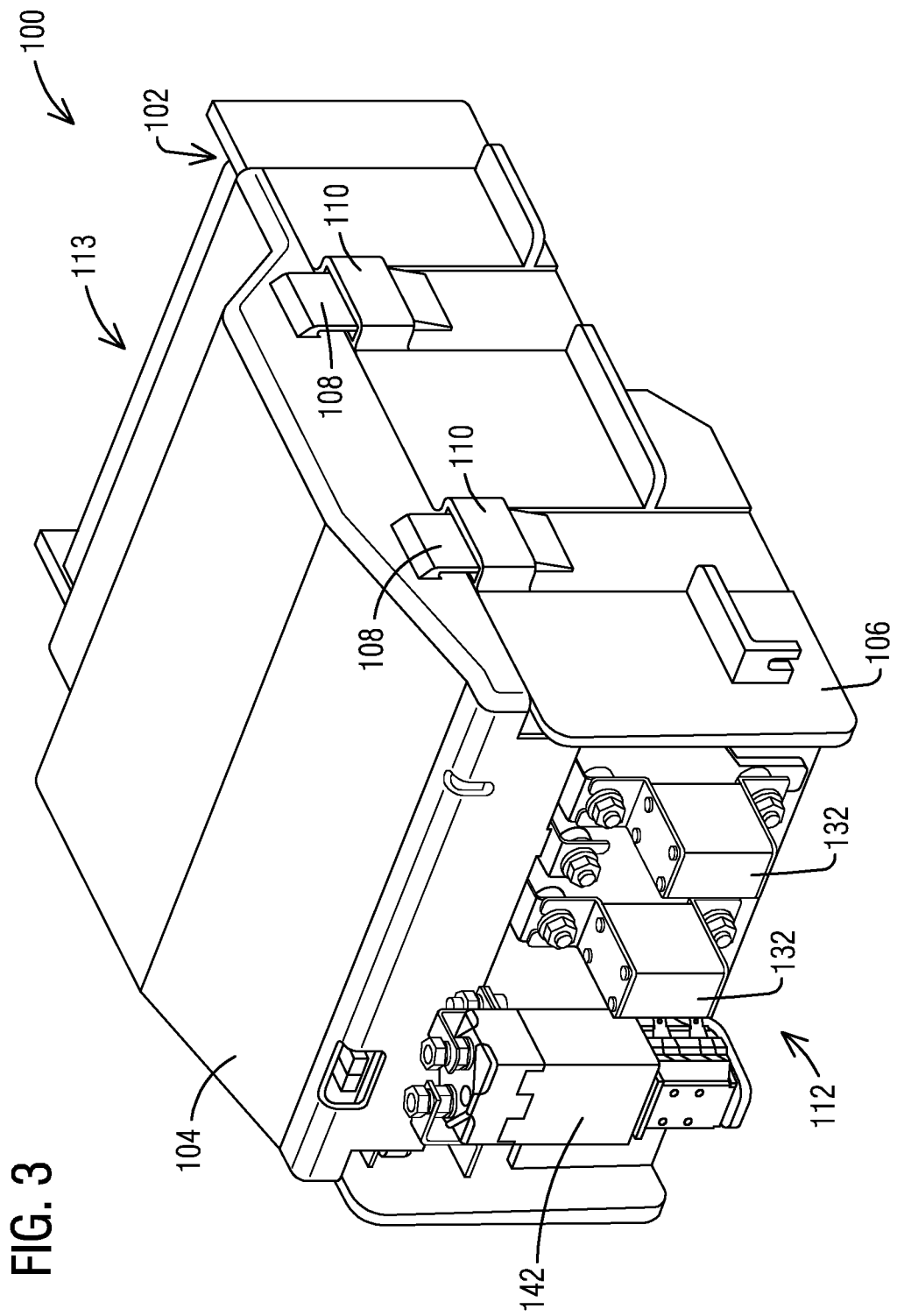
FIG. 3 illustrates a perspective view of a printed circuit board power cell with isolation in accordance with an exemplary embodiment of the present invention.

FIG. 3 illustrates a perspective view of a printed circuit board (PCB) power cell 100 in accordance with an exemplary embodiment of the present invention.

As noted before, a known enclosure for a power supply or drive system, for example of a known power supply 10 as described for example in FIG. 1, is metallic and at least parts of each power cell enclosure are also metallic. Therefore, when the power cells are mounted in a drive system cabinet, additional work is required to maintain proper isolation between the various power cells and between the power cells and the system cabinet. Such proper isolation typically requires insulating non-conductive material which needs to be added to the drive system which is expensive and further increases labour costs of the drive.

As illustrated in FIG. 3, the power cell 100 comprises a housing assembly 102 which forms an outside shell of the power cell 100 and houses electric and electronic components of the power cell 100. The housing assembly 102 is modular and can comprise multiple components or sections, herein referred to as multiple section housing. When assembling the power cell 100, the electric/electronic components are placed inside the housing assembly 102 (see also FIG. 4).

According to an exemplary embodiment, the housing assembly 102 comprises a multiple section housing, specifically an upper housing section 104 and a lower housing section 106. The upper housing section 104 can be also referred to as housing cover. The upper and lower housing sections 104 and 106 are complementary components, which, when assembled, form the housing assembly 102. It should be noted that the housing assembly 102 can comprise more than two sections, depending on for example manufacturing or assembling processes of the power cell 100.

The upper housing section 104 and the lower housing section 106 can comprise elements for coupling the upper and lower sections 104, 106 to each other in order to provide a secure connection between the two sections 104, 106. For example, the lower housing section 106 can comprise one or more openings 110 for receiving one or more projections 108 of the upper housing section 104. According to FIG. 3, the projections 108 and openings 110 can be located on opposite sides of the housing assembly 102. One of ordinary skill in the art can conceive many other embodiments for securing the upper and lower housing sections 104, 106 to each other, such as bolts, screws etc.

According to an exemplary embodiment, the PCB power cell 100 comprises built-in voltage isolation, herein also referred to as integrated voltage isolation. Such built-in voltage isolation is achieved by configuring the power cell 100 to comprise non-conductive material. The power cell 100 can further comprise a specific arrangement and/or spacing of the electric and electronic components inside the power cell 100. For example, the housing assembly 102 comprises non-conductive material, and can be a multiple piece (section) mold comprising non-conductive material. The non-conductive material can comprise solid plastic material and can be for example glass fiber reinforced plastic material. In an exemplary embodiment, the upper housing section 104 and lower housing section 106 each comprise non-conductive material that provides voltage isolation for each power cell 100. For example, the upper housing section 104 and the lower housing section 106 are each made of non-conductive material. The upper and lower housing sections 104, 106 can be one-piece components, for example one-piece molded components comprising glass fiber reinforced plastic material.

Figure 5:
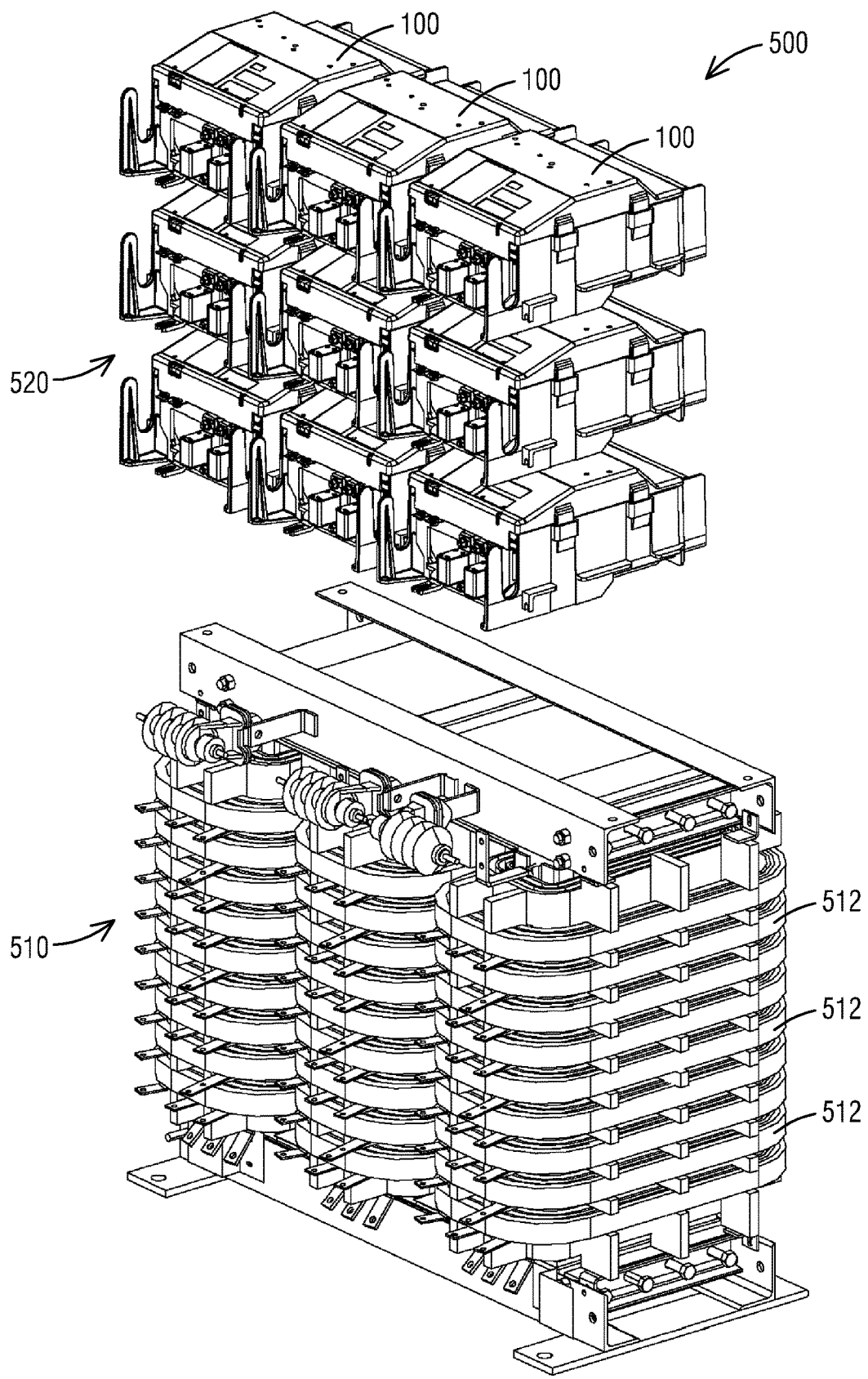
FIG. 5 illustrates a perspective view of a medium voltage multi-cell power supply in accordance with an exemplary embodiment of the present invention.

As described before, the PCB power cell 100 is for arranging in a multi-cell power supply (see FIG. 5). The integrated voltage isolation of the power cell 100 supports an output voltage of the multi-cell power supply. When the multi-cell power supply comprises multiple power cells 100, each power cell 100 comprises integrated voltage isolation that individually supports an output voltage of the multi-cell power supply. For example, an output voltage of the multi-cell power supply can be at least 11 kV, wherein then an isolation voltage of each power cell 100 is at least 11 kV, while a rated voltage of each power cell 100 can be of a lower voltage, for example less than 3 kV. Since each power cell 100 is individually isolated, a more compact construction of a power supply comprising multiple power cells 100 is possible as the power cells 100 may be placed much closer together and may also be connected against a metal backplane. Such a more compact power supply will be described later with reference to FIG. 5.

According to a further aspect, each power cell 100 comprises a bypass mechanism 142 and a plurality of input fuses 132. The input fuses 132 are operably connected to a three-phase AC input 130 (see FIG. 4), and the bypass mechanism 142 is operably connected to a single-phase AC output 140 (see FIG. 4). The input fuses 132 provide over-current (excess current) protection, of either a load circuit or source circuit. The bypass mechanism 142 allows bypassing a failed power cell and continuing to operate a multi-cell power supply at reduced capacity. For example, a power cell failure may be detected by comparing a cell output voltage to a commanded output, by checking or verifying cell components, through the use of diagnostics routines, etc. Otherwise, without a bypass mechanism, when a given power cell of a multi-cell power supply fails in an open-circuit mode, current through all the power cells in that phase-group will go to zero, and further operation is not possible.

Figure 4:
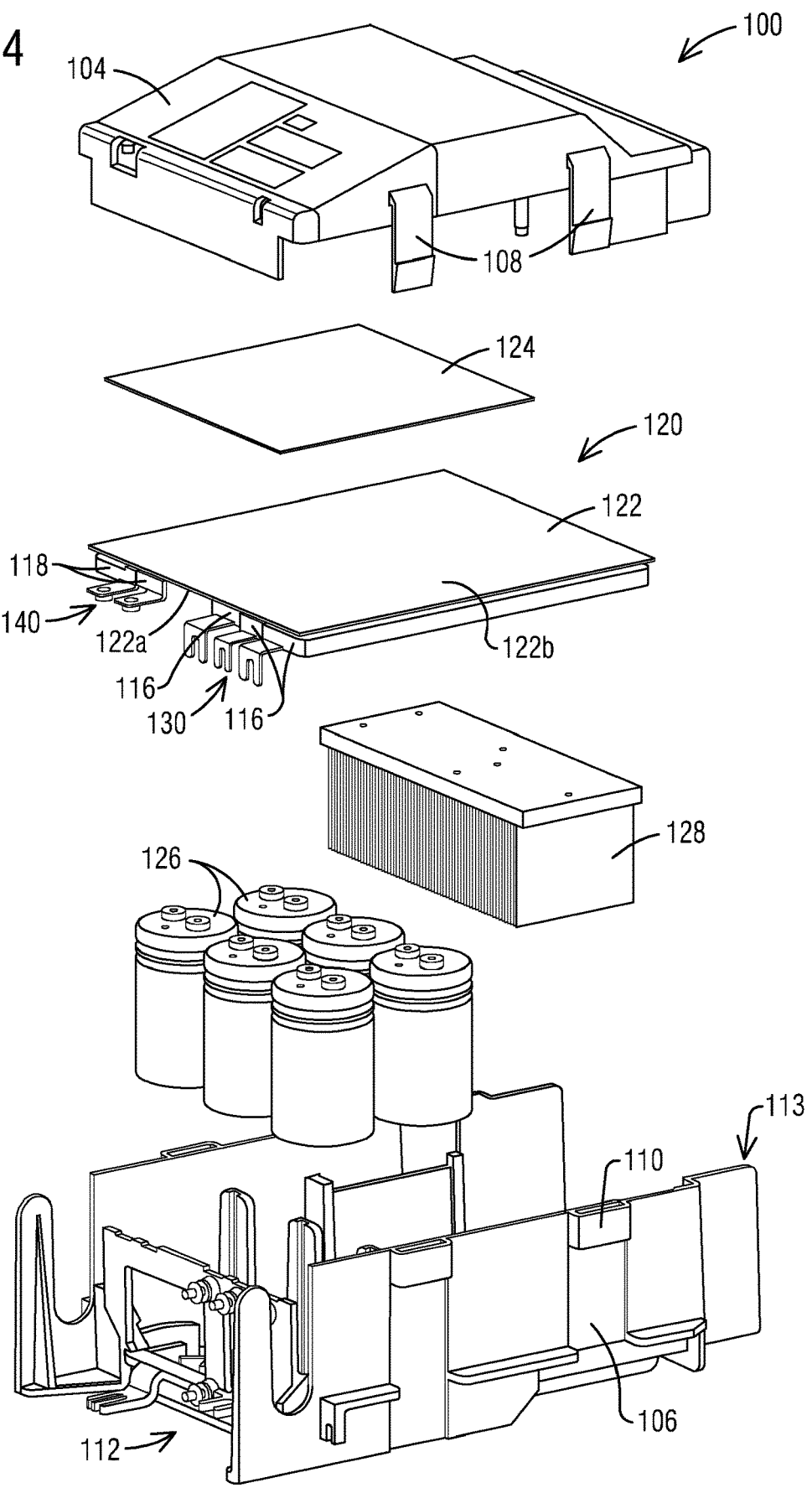
FIG. 4 illustrates an exploded perspective view of a printed circuit board power cell with isolation in accordance with an exemplary embodiment of the present invention.

The bypass mechanism 142 and input fuses 132 are located outside the housing assembly 102, but, as noted before, are operably coupled to the three-phase AC input 130 and single-phase AC output 140 which are located inside the housing assembly 102 of the power cell 100 (see FIG. 4). Specifically, the bypass mechanism 142 and the input fuses 132 are located at a front 112 of the power cell 100. The front 112 of the power cell 100 faces an operator or user when the power cell 100 is arranged in a multi-cell power supply (see FIG. 5). Thus, the bypass mechanism 142 and the input fuses 132 are easily accessible, for example by the operator or user. Typically, a bypass mechanism and input fuses are connected elsewhere in a power supply which means additional connections and increased labor costs for the power system. Mounting the bypass mechanism 142 and the input fuses 132 at the front 112 of the power cell 100 simplifies overall wiring of the power supply and offers increased accessibility to system connections.

FIG. 4 illustrates an exploded perspective view of a printed circuit board power cell 100 in accordance with an exemplary embodiment of the present invention. As described before with reference to FIG. 3, the power cell 100 comprises the upper housing section 104 and the lower housing section 106, which comprise non-conductive material.

The power cell 100 houses different electric and/or electronic components of the power cell 100. For example, a PCB assembly 120 is positioned inside the housing assembly 102. The PCB assembly 120 of the power cell 100 can comprise one or more printed circuit boards (PCBs). In an exemplary embodiment, the power cell 100 comprises a first PCB 122 and a second PCB 124. The PCBs 122, 124 can be multilayer PCBs or single layer PCBs. Different passive and active components can be mounted, for example soldered, on the PCBs 122, 124.

The power cell 100 comprises a plurality of capacitors 126 that are each connected, for example soldered, to the first PCB 122. The capacitors 126 may include, but are not limited to, electrolytic capacitors and film capacitors. In various embodiments, the number, type and placement of the plurality of capacitors 126 may vary depending on the capacitor technology and desired performance characteristics of the power cell 100. The capacitors 126 are mounted on a first surface 122a of the first PCB 122. The power cell 100 further comprises at least one heat sink 128 that is also disposed on the first surface 122a of the first PCB 122. It should be noted that the capacitors 126 and/or the at least one heat sink 128 can be mounted on either surface 122a, 122b of the first PCB 122 depending on for example a desired PCB configuration and/or the used capacitor technology.

As noted before, the power cell 100 comprises the three-phase AC input 130, and the single-phase AC output 140. The three-phase AC input 130 and the single-phase AC output 140 are each disposed on the first surface 122a of the first PCB 122 which is opposite a second surface 122b of the first PCB 122.

According to an exemplary embodiment, the three-phase AC input 130 and the single-phase AC output 140 are located at the front 112 of the power cell 100 (see also FIG. 3). As best shown in FIG. 4, the three-phase AC input 130 and single-phase AC output 140 are coupled to the PCB 122 at the first side 122a by individual laminated bus bars 116, 118. A first laminated bus bar 116 comprises one or more individual input bus bars and couples the three-phase AC input 130 to the PCB 122. A second laminated bus bar 118 comprises one or more individual output bus bars and couples the single-phase AC output 140 to the PCB 122. Each laminated bus bar 116, 118 is configured to, at least partially, cancel magnetic field(s) produced by the individual input or output bus bars, thus eliminating potential noise effects on the PCB 122. It should be noted that the laminated bus bars 116, 118 can be mounted on either surface 122a, 122b of the first PCB 122 depending on for example a desired PCB configuration of the power cell 100.

The lower housing section 106 is configured such that, when assembling the power cell 100, the components of the power cell 100, for example the PCBs 122, 124 including their respective passive and/or active devices, can be placed into the lower housing section 106. After all components of the power cell 100 are placed into the lower housing section 106, the upper housing section 104, also referred to as housing cover, is placed on top and coupled to the lower housing section 104 via the projections 108 inserted in the openings 110.

It should be noted that the power cell 100, including the PCBs 122, 124, can comprise many other components or devices which are not described in detail herein, such as for example multiple solid state converters with an intermediate direct current (DC) link.

FIG. 5 illustrates a perspective view of a medium voltage multi-cell power supply 500 in accordance with an exemplary embodiment of the present invention.

The power supply 500 is implemented as a drive, such as for example a modular medium voltage drive, including one or more power cells 100 as described in FIGS. 3 and 4. The multi-cell power supply 500 includes a transformer 510 and a power circuit 520 that comprises a plurality of the power cells 100. The transformer 510 includes a three-phase primary winding that excites a plurality of three-phase secondary windings 512, wherein the power cells 100 are operably coupled to the secondary windings 512, respectively. One power cell 100 is operably coupled to one secondary winding 512. In the exemplary embodiment of FIG. 5, the power supply 500 comprises nine power cells 100 and nine secondary windings 512. Of course, the power supply 500 can comprise more or less than nine power cells 100 and/or more or less than nine secondary windings 512 depending on a type of the power supply 500 and/or a type of a load, which is for example an electrodynamic machine, coupled to the power supply 500.

According to an exemplary embodiment, a voltage isolation of the power supply 500 is incorporated into the individual power cells 100 instead of being part of the design of the power supply 500. Thus, as described with reference to FIGS. 3 and 4, each power cell 100 comprises built-in voltage isolation, wherein an isolation voltage of each power cell 100 can be at least 11 kV. This is achieved by non-conductive materials and, if necessary, spacing of components within each power cell 100. In particular, the housing assembly 102 of each power cell 100 comprises non-conductive material and can be a multiple piece mold comprising non-conductive material. Such a configuration of the power cells 100 with appropriate non-conductive materials and spacing provides that each power cell 100 has a voltage isolation capability that supports an entire voltage, specifically output voltage, of the power supply 500.

The power supply 500 with its series of low voltage power cells 100 linked together to create a medium voltage power output can be scaled for a wide range of voltages and output power. For example, when each power cell 100 comprises built-in voltage isolation of at least 11 kV, the entire power supply voltage can be up to 11 kV. But the power supply voltage can also be lower than 11 kV, for example 4 kV. Typically, the power cells 100 are placed in a cell cabinet. Since each power cell 100 comprises individual voltage isolation, a design of the power supply 500 is simplified because there is no need to adjust for example the cell cabinet for different output voltages of the power supply 500.

Since each individual power cell 100 comprises built-in voltage isolation of at least 11 kV, each power cell 100 can be connected to and/or supported by a metal backplane of the power supply 500 comprising an output/input voltage of 11 kV. The backplane provides support and structure when arranging the power cells 100 for the power supply 500. The power cells 100 are supported by the metal backplane at a back 113 of the power cell 100, the back 113 being opposite the front 112 of the power cell 100 (see FIG. 3).

Furthermore, the power cells 100 comprise an easy front access for the three-phase AC input 130 and the single-phase AC output 140. The bypass mechanism 142 and input fuses 132 of each power cell 100 are mounted outside the housing assembly 102 thereby providing a compact, integrated power electronics cell block comprising power circuits, control circuits, protections components and redundancy features. It should be noted that the power supply 500 can comprise many other components which are not described in detail herein, such as mounting features or cooling assemblies.

Figure 6:
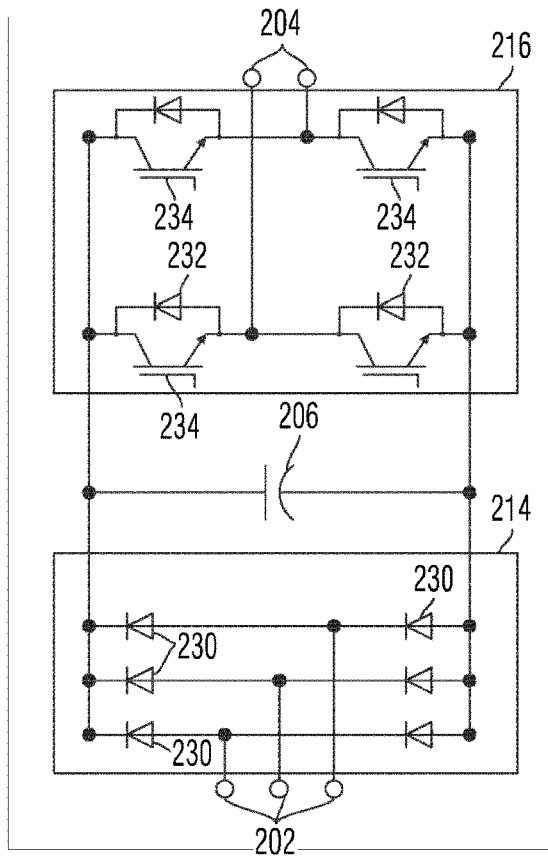
FIG. 6 and FIG. 7 illustrate exemplary circuit diagrams of a printed circuit board power cell in accordance with exemplary embodiments of the present invention.
Figure 7:
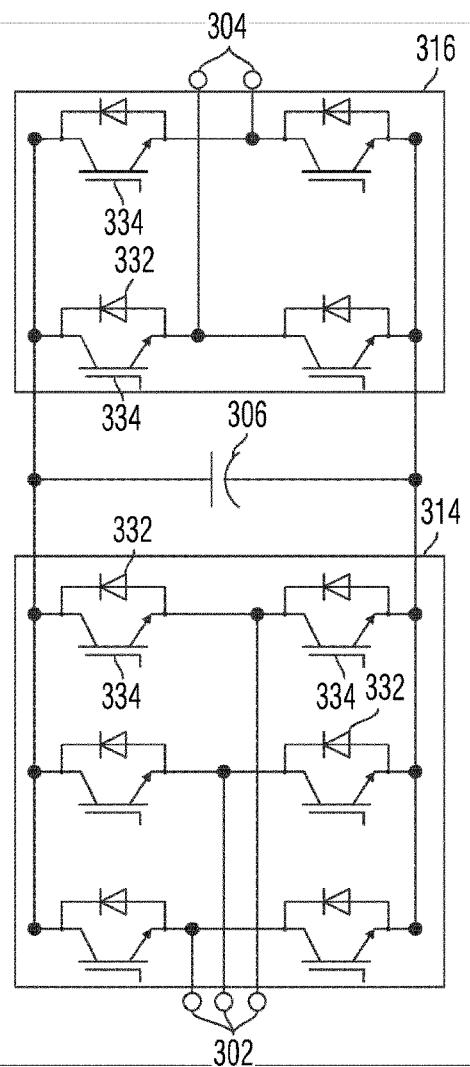

FIG. 6 and FIG. 7 illustrate exemplary circuit diagrams of a power cell, such as for example a power cell 26 of a multi-cell power supply 10 as shown for example in FIG. 1.

Figure 8:
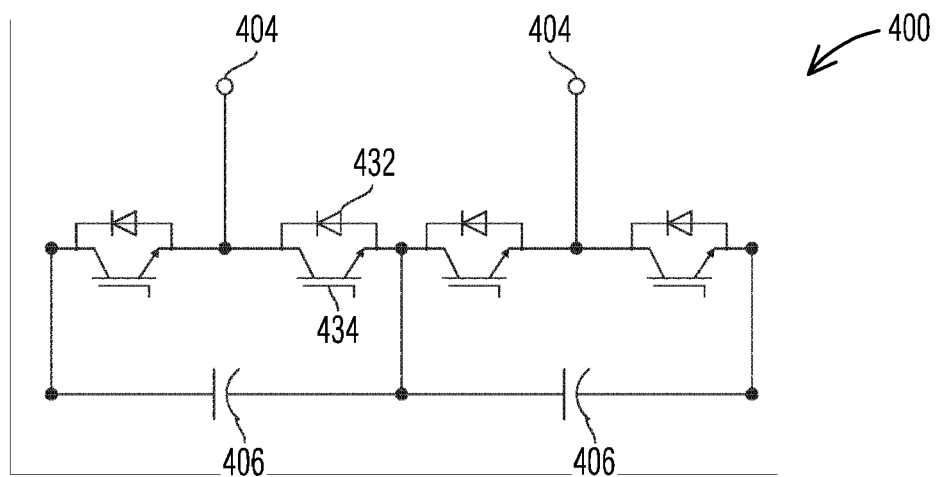
FIG. 8 and FIG. 9 illustrate further exemplary circuit diagrams of printed circuit board power cells in accordance with exemplary embodiments of the present invention.
Figure 9:
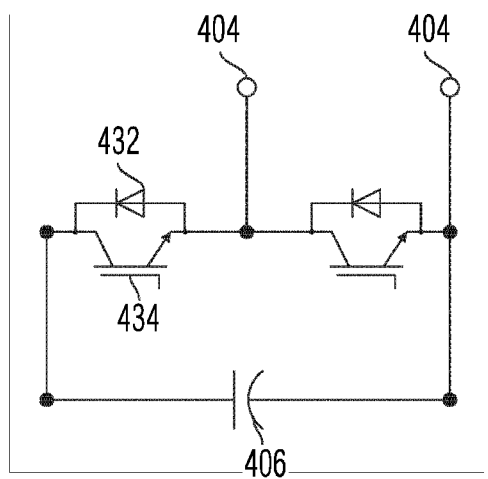

FIG. 8 and FIG. 9 illustrate further exemplary circuit diagrams of a power cell, such as for example a power cell 28 of a multi-cell power supply 10 as shown for example in FIG. 2.

The circuit diagrams of FIGS. 6-9 can be constructed with a printed circuit board as described and presented herein. It will be appreciated by those of ordinary skill in the art that a wide variety of alternative circuits and components may be used to achieve the desired technical effects. In the case of the circuits as shown in FIGS. 8 and 9, no rectifier module is included and, consequently, no three-phase AC input is received directly into the power cell 100.

In an exemplary embodiment, the PCB power cell 100 with isolation as described herein can include circuitry as illustrated in one or more diagrams of FIGS. 6-9. For example, with reference to FIG. 3, the first PCB 122 and/or the second PCB 124 can comprise the circuitry as illustrated in FIGS. 6-9.

Referring to FIG. 6, a circuit diagram of a power cell 200 in accordance with an exemplary embodiment is illustrated. The power cell 200 includes a diode bridge 214 which is connected to a three-phase AC input 202 and an H-Bridge inverter 216 which is connected to a single-phase AC output 204. The diode bridge 214 receives the three-phase AC power and converts it into DC power. In exemplary embodiments, the power cell 200 also includes a capacitor 206 which is connected to both the diode bridge 214 and the H-Bridge inverter 216. Although the capacitor 206 is shown as a single capacitor 206, it will be appreciated by those of ordinary skill in the art that the capacitor 206 can include number of capacitors in a series/parallel combination. The diode bridge 214 includes a plurality of diodes 230 and the H-Bridge inverter 216 includes a plurality of diodes 232 and transistors 234. In exemplary embodiments, the diode configuration of the diode bridge 214 shown can also be realized using thyristors. The transistors 234 can be for example FETs, BJTs, IGBTs, or the like.

Referring to FIG. 7, a circuit diagram of a power cell 300 in accordance with an exemplary embodiment is shown. As illustrated, the power cell 300 includes an active-front-end converter 314 which is connected to a three-phase AC input 302 and an H-Bridge inverter 316 which is connected to a single-phase AC output 304. The active-front-end converter 314 receives the three-phase AC power and converts it into DC power. In exemplary embodiments, power cell 300 also includes a capacitor 306 which is connected to both the first portion 314 and the second portion 316. Although the capacitor 306 is shown as a single capacitor 306, it will be appreciated by those of ordinary skill in the art that the capacitor 306 can include number of capacitors in a series/parallel combination. In exemplary embodiments, the active-front-end converter 314 and the H-Bridge inverter 316 include a plurality of diodes 332 and transistors 334. The transistors 334 can be for example FETs, BJTs, IGBTs, or the like.

Referring now to FIG. 8 and FIG. 9, circuit diagrams of a single half-bridge converter 450 and a double half-bridge converter 400 in accordance with an exemplary embodiment are respectively shown. In exemplary embodiments, the half-bridge converters 400, 450 also include one or more capacitors 406. In exemplary embodiments, each capacitor 406 can include number of capacitors in a series/parallel combination. The double half-bridge converter 400 and the single half-bridge converter 450 include a plurality of diodes 432 and transistors 434. The transistors 434 can be for example FETs, BJTs, IGBTs, or the like.

While embodiments of the present invention have been disclosed in exemplary forms, it will be apparent to those skilled in the art that many modifications, additions, and deletions can be made therein without departing from the spirit and scope of the invention and its equivalents, as set forth in the following claims.

The invention claimed is:

1. A printed circuit board (PCB) power cell for arranging in a multi-cell power supply, the PCB power cell comprising:
   a housing assembly comprising a multiple section housing; and
   a PCB assembly positioned within the housing assembly;
   wherein the housing assembly and the PCB assembly are configured to provide an integrated voltage isolation which supports an output voltage of the multi-cell power supply, and
   further comprising a three-phase AC input and a single-phase AC output coupled to the PCB assembly by individual laminated bus bars;
   a plurality of input fuses operably coupled to the three-phase AC input; and
   a bypass mechanism operably coupled to the single-phase AC output,
   wherein the plurality of input fuses and the bypass mechanism are positioned outside the housing assembly.

2. The PCB power cell for arranging in a multi-cell power supply of claim 1, wherein the housing assembly comprises non-conductive material.

3. The PCB power cell for arranging in a multi-cell power supply of claim 1, wherein sections of the multiple section housing each comprise non-conductive material.

4. The PCB power cell for arranging in a multi-cell power supply of claim 2, wherein the non-conductive material comprises glass fiber reinforced plastic material.

5. The PCB power cell for arranging in a multi-cell power supply of claim 2, wherein the sections of the multiple section housing are each one-piece molded components comprising glass fiber reinforced plastic material.

6. The PCB power cell for arranging in a multi-cell power supply of claim 1, wherein the output voltage of the multi-cell power supply is at least 11 kV, and the integrated voltage isolation of the power cell comprises an isolation voltage of at least 11 kV.

7. The PCB power cell for arranging in a multi-cell power supply of claim 1, wherein a rated voltage of the power cell is less than 3 kV.

8. A multi-cell power supply for receiving power from a source and delivering power at an output to a load, the power supply comprising:
   a power circuit comprising a plurality of printed circuit board (PCB) power cells, each PCB power cell comprising:
      a housing assembly comprising a multiple section housing; and
      a PCB assembly positioned within the housing assembly;
      wherein the housing assembly and the PCB assembly are configured to provide an integrated voltage isolation which supports an output voltage of the multi-cell power supply,
   wherein each power cell further comprises:
      a three-phase AC input and a single-phase AC output coupled to the PCB assembly by individual laminated bus bars, the three-phase AC input and single-phase AC output being located at a front of the power cell;
      a plurality of input fuses operably coupled to the three-phase AC input; and
      a bypass mechanism operably coupled to the single-phase AC output,
      wherein the plurality of input fuses and the bypass mechanism are positioned outside the housing assembly at the front of the power cell,
   wherein the multi-cell power supply further comprises
   a transformer comprising a primary winding and a plurality of secondary windings, the plurality of power cells being operably coupled to the plurality of secondary windings.

9. The multi-cell power supply of claim 8, wherein the housing assembly comprises non-conductive material.

10. The multi-cell power supply of claim 9, wherein the non-conductive material comprises glass fiber reinforced plastic material.

11. The multi-cell power supply of claim 8, wherein sections of the multiple section housing are each made of non-conductive material.

12. The multi-cell power supply of claim 8, wherein the output voltage of the multi-cell power supply is at least 11 kV, and each power cell comprises an isolation voltage of at least 11 kV.

13. The multi-cell power supply of claim 8, wherein a rated voltage of each power cell is less than 3 kV.

14. The multi-cell power supply of claim 8, further comprising:
   a backplane, wherein each power cell is supported by the backplane at a back of the power cell, the back being opposite the front of the power cell.

15. The multi-cell power supply of claim 14, wherein the backplane is configured as a metal backplane.

* * * * *